United States Patent
Hou et al.

(10) Patent No.: US 11,764,750 B2
(45) Date of Patent: Sep. 19, 2023

(54) SUPPORT STRUCTURE FOR BULK ACOUSTIC WAVE RESONATOR

(71) Applicant: Global Communication Semiconductors, LLC, Torrance, CA (US)

(72) Inventors: Liping D. Hou, Torrance, CA (US); Kun-Mao Pan, Harbor City, CA (US); Shing-Kuo Wang, Torrance, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 922 days.

(21) Appl. No.: 16/455,627

(22) Filed: Jun. 27, 2019

(65) Prior Publication Data
US 2020/0028482 A1    Jan. 23, 2020

Related U.S. Application Data

(60) Provisional application No. 62/701,382, filed on Jul. 20, 2018.

(51) Int. Cl.
*H03H 9/02*    (2006.01)
*H03H 9/05*    (2006.01)
(Continued)

(52) U.S. Cl.
CPC .......... *H03H 9/02102* (2013.01); *H03H 3/02* (2013.01); *H03H 9/0504* (2013.01);
(Continued)

(58) Field of Classification Search
CPC .................................. H03H 9/02; H03H 9/54
See application file for complete search history.

(56) References Cited

U.S. PATENT DOCUMENTS

| 4,320,365 A | 3/1982 | Black et al. |
| 5,448,014 A | 9/1995 | Kong et al. |

(Continued)

FOREIGN PATENT DOCUMENTS

| JP | 2016140053 A | 8/2016 |
| TW | 200610266 A | 3/2006 |
| WO | WO2020132997 A1 | 7/2020 |

OTHER PUBLICATIONS

Yoo et al., Spurious Resonances and Modelling of Composite Resonators, Department of Physics, The Catholic University of America, Washington, D.C., © 1983 IEEE, 3 pgs.

(Continued)

*Primary Examiner* — Hafizur Rahman
*Assistant Examiner* — Alan Wong
(74) *Attorney, Agent, or Firm* — Morgan, Lewis & Bockius LLP

(57) ABSTRACT

Devices and processes for preparing devices are described for a bulk acoustic wave resonator. A stack includes a first electrode that is coupled to a first side of a piezoelectric layer and a second electrode that is coupled to a second side of the piezoelectric layer. The stack is configured to resonate in response to an electrical signal applied between the first electrode and the second electrode. A cavity frame is coupled to the first electrode and to the substrate. The cavity frame forms a perimeter around a cavity. Optionally, a heat dissipating frame is formed and coupled to the second electrode. The cavity frame and/or the heat dissipating frame improve the thermal stability of the bulk acoustic resonator.

15 Claims, 11 Drawing Sheets

(51) Int. Cl.
*H03H 3/02* (2006.01)
*H10N 30/09* (2023.01)
*H03H 9/13* (2006.01)
*H10N 30/06* (2023.01)

(52) U.S. Cl.
CPC .............. *H03H 9/13* (2013.01); *H10N 30/06* (2023.02); *H10N 30/09* (2023.02); *H03H 2003/021* (2013.01)

(56) References Cited

U.S. PATENT DOCUMENTS

| | | | |
|---|---|---|---|
| 5,578,974 | A | 11/1996 | Yang et al. |
| 5,587,620 | A | 12/1996 | Ruby et al. |
| 5,873,153 | A | 2/1999 | Ruby et al. |
| 5,894,647 | A | 4/1999 | Lakin |
| 6,060,818 | A | 5/2000 | Ruby et al. |
| 6,150,703 | A | 11/2000 | Cushman et al. |
| 6,262,637 | B1 | 7/2001 | Bradley et al. |
| 6,278,342 | B1 | 8/2001 | Ella |
| 6,424,237 | B1 | 7/2002 | Ruby et al. |
| 6,693,500 | B2 | 2/2004 | Yang et al. |
| 6,828,713 | B2 | 12/2004 | Bradley et al. |
| 6,842,088 | B2 * | 1/2005 | Yamada .............. H03H 9/02149 310/322 |
| 7,327,073 | B2 | 2/2008 | Shearer et al. |
| 7,345,410 | B2 | 3/2008 | Grannen et al. |
| 7,408,428 | B2 | 8/2008 | Larson, III |
| 7,522,018 | B2 | 4/2009 | Milsom et al. |
| 7,737,806 | B2 * | 6/2010 | Taniguchi .......... H03H 9/02133 333/192 |
| 8,330,556 | B2 * | 12/2012 | Miller ...................... H03H 3/04 427/100 |
| 8,896,395 | B2 * | 11/2014 | Burak ................ H03H 9/02086 333/191 |
| 9,197,185 | B2 | 11/2015 | Zou et al. |
| 9,246,079 | B2 | 1/2016 | Umeda et al. |
| 9,246,473 | B2 | 1/2016 | Burak et al. |
| 9,374,059 | B1 | 6/2016 | Hurwitz et al. |
| 9,401,692 | B2 | 7/2016 | Burak |
| 9,479,139 | B2 | 10/2016 | Ruby et al. |
| 9,634,643 | B2 | 4/2017 | Shin et al. |
| 9,842,980 | B2 | 12/2017 | Park et al. |
| 10,079,334 | B2 | 9/2018 | Moulard et al. |
| 10,298,197 | B2 * | 5/2019 | Lee ......................... H03H 9/564 |
| 10,601,391 | B2 | 3/2020 | Stokes et al. |
| 10,630,259 | B2 * | 4/2020 | Hurwitz ............... H03H 9/1014 |
| 11,424,729 | B2 * | 8/2022 | Lee ........................ H03H 9/174 |
| 11,616,489 | B2 * | 3/2023 | Wang .................... H03H 9/568 333/187 |
| 2005/0012568 | A1 | 1/2005 | Aigner |
| 2005/0179508 | A1 | 8/2005 | Sato |
| 2010/0019866 | A1 | 1/2010 | Hara et al. |
| 2010/0148637 | A1 | 6/2010 | Satou |
| 2011/0080233 | A1 | 4/2011 | Petit et al. |
| 2011/0227671 | A1 | 9/2011 | Zhang |
| 2011/0298564 | A1 | 12/2011 | Iwashita et al. |
| 2012/0205754 | A1 | 8/2012 | Iwamoto |
| 2013/0057115 | A1 | 3/2013 | Saito et al. |
| 2013/0140959 | A1 | 6/2013 | Shin et al. |
| 2014/0125203 | A1 | 5/2014 | Choy et al. |
| 2014/0354109 | A1 | 12/2014 | Grannen et al. |
| 2016/0065171 | A1 | 3/2016 | Ruby et al. |
| 2016/0294354 | A1 | 10/2016 | Saijo et al. |
| 2017/0149405 | A1 | 5/2017 | Kishimoto |
| 2018/0138885 | A1 | 5/2018 | Stokes et al. |
| 2019/0149129 | A1 | 5/2019 | Ueda |
| 2019/0356293 | A1 * | 11/2019 | Kim ...................... H03H 9/132 |
| 2020/0220520 | A1 | 7/2020 | Stokes et al. |
| 2020/0313648 | A1 | 10/2020 | Wang et al. |
| 2020/0389150 | A1 | 12/2020 | Wang et al. |
| 2021/0006220 | A1 * | 1/2021 | Schiek .............. H03H 9/02102 |
| 2021/0111693 | A1 | 4/2021 | Hou et al. |
| 2021/0111699 | A1 | 4/2021 | Hou et al. |
| 2021/0111701 | A1 | 4/2021 | Hou et al. |
| 2021/0111702 | A1 | 4/2021 | Wang et al. |
| 2021/0250012 | A1 | 8/2021 | Hou et al. |

OTHER PUBLICATIONS

Yoo et al., Spurious Resonances in Bulk Acoustic Wave Resonators, Department of Physics, The Catholic University of America, Washington, D.C., © 1982 IEEE, 1982 Ultrasonics Symposium, 4 pgs.
Working principles and Applications of SAW/FBAR Devices, Taiyo Yuden Navigator, Oct. 2017, 6 pgs.
Stokes, Notice of Allowance, U.S. Appl. No. 15/789,109, dated Nov. 14, 2019, 11pgs.
Wang, Office Action, U.S. Appl. No. 16/368,754, dated Jul. 13, 2022, 7pgs.
Wang, Office Action, U.S. Appl. No. 17/002,498, dated Jul. 12, 2022, 12pgs.
Global Communication Semiconductors, Inc., CN Office Action, Chinese Application No. 201711127532.1, dated Nov. 22, 2022, 23 pgs.
Global Communication Semiconductors, Inc., U.S. Non-Final Office Action, U.S. Appl. No. 16/820,625, dated Nov. 14, 2022, 10 pgs.
Global Communication Semiconductors, Inc., U.S. Non-Final Office Action, U.S. Appl. No. 17/071,831, dated Jul. 17, 2023, 12 pgs.
Global Communication Semiconductors, Inc., Restriction Election, U.S. Appl. No. 17/071,836, dated Jun. 21, 2023, 7 pgs.
Global Communication Semiconductors, Inc., U.S. Final Office Action, U.S. Appl. No. 17/002,498, dated Jun. 7, 2023, 16 pgs.

* cited by examiner

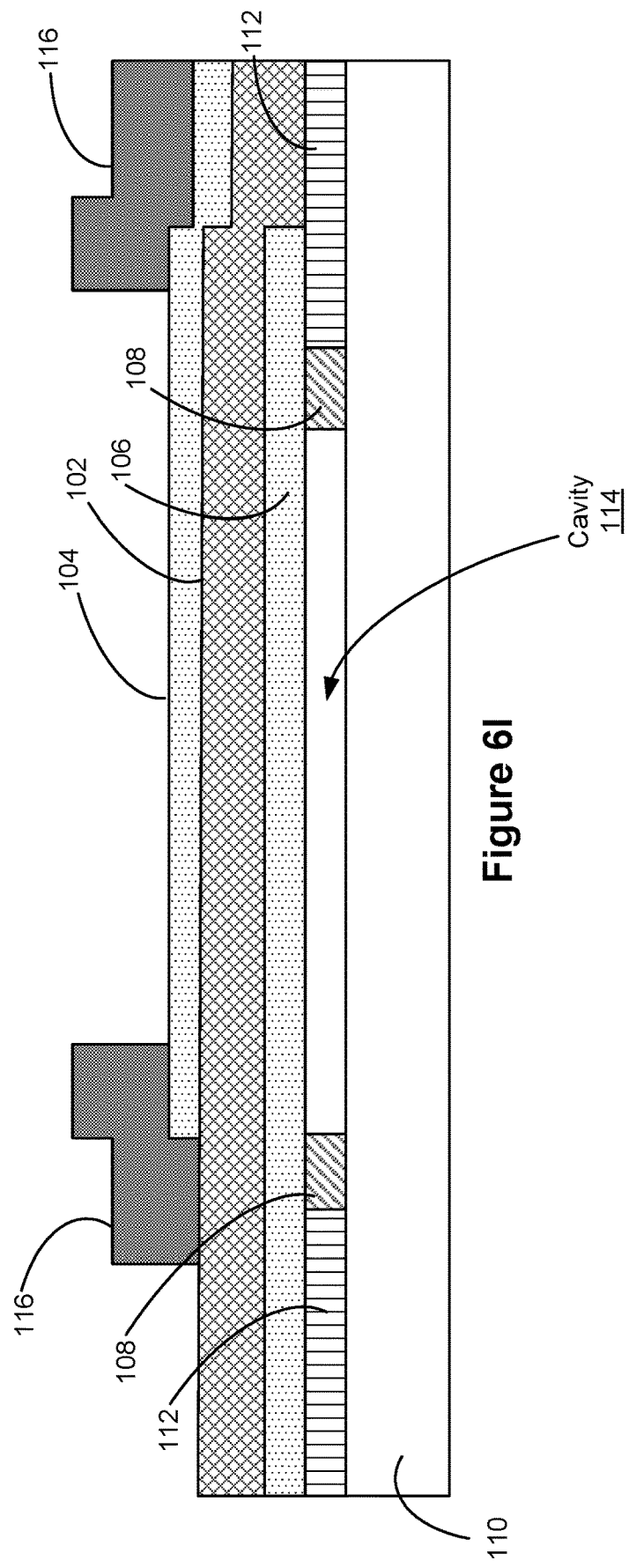

SUPPORT STRUCTURE FOR BULK ACOUSTIC WAVE RESONATOR

RELATED APPLICATIONS

This application is a non-provisional application of and claims priority to U.S. Provisional Patent Application No. 62/701,382, filed Jul. 20, 2018, entitled, "Support Structure for Bulk Acoustic Wave Resonator," which is hereby incorporated by reference in its entirety.

TECHNICAL FIELD

The disclosed embodiments relate generally to bulk acoustic resonators, and in particular, to film bulk acoustic resonators with structures for improved manufacturability and reduced thermal resistance.

BACKGROUND

A bulk acoustic wave (BAW) resonator includes a stack of a bottom electrode, a piezoelectric thin film layer, and a top electrode. (The bottom electrode, the piezoelectric thin film layer, and the top electrode are collectively referred to herein as the "stack.") When an electrical signal is applied to the top and bottom electrodes, the piezoelectric thin film layer converts the electrical energy of the signal into mechanical energy (also referred to herein as acoustical energy). An oscillating electrical signal applied to the piezoelectric thin film layer causes pressure and/or shear waves to propagate through the bulk of the BAW stack. The waves in the stack are referred to as bulk acoustic waves. The bulk acoustic waves have their primary resonance in the stack at frequencies that are determinable from the thicknesses of the piezoelectric film and electrode layers.

For high performance operation, acoustic isolation of a resonator stack from a substrate is necessary to reduce leakage of acoustical energy generated by the resonator stack into the surrounding structure. Acoustic isolation of the resonator stack has been achieved by creating a cavity that separates the resonator stack from the substrate on which the resonator stack is formed. For example, a resonator stack is fabricated over a silicon oxide sacrificial layer that is deposited on a silicon substrate. Metal columns are formed in vias created in the silicon oxide layer. The silicon oxide layer is etched by a liquid etchant to create a cavity between the resonator stack and the substrate, leaving the resonator stack suspended on metal columns. A resonator stack that is suspended over a cavity and only supported by metal columns is vulnerable to stability issues. Additionally, using a liquid etchant to remove the silicon oxide layer endangers circuit elements, which are vulnerable to damage by the etchant.

Another existing approach to acoustic isolation of a resonator stack involves etching a cavity into a substrate, filling the cavity with sacrificial material, and, after forming the resonator stack over the sacrificial material, removing the sacrificial material to form a cavity under the resonator stack. With this approach, there is a lack of control over the cavity depth and shape due to the lack of an etch stop and the crystallographic dependence of the etch profile.

BAW resonators are typically designed to resonate at a particular frequency (thereby acting as a filter). The frequency at which the BAW resonator resonates is affected by changes in temperature. As the BAW resonator resonates, the motion of the resonator generates heat, causing temperature changes that have the potential to cause the filter's pass band and rejection band frequencies to shift out of the specification tolerance.

SUMMARY

Without limiting the scope of the appended claims, after considering this disclosure, and particularly after considering the section entitled "Detailed Description," one will understand how the aspects of various embodiments are used to address the issues described above (e.g., by improving structural integrity of the structure that supports the BAW stack). For example, supporting a BAW stack over a cavity using a cavity frame and planarization material improves the structural integrity of the resonator. In some embodiments, one or more elements of the BAW resonator described herein (e.g., a cavity frame and/or a heat dissipation) dissipate heat generated in the resonator stack.

In some embodiments, a bulk acoustic resonator includes a stack that includes a first electrode (bottom electrode) coupled to a first side of a piezoelectric layer and a second electrode (top electrode) coupled to a second side of the piezoelectric layer. The stack is configured to resonate in response to an electrical signal applied between the first electrode and the second electrode. A cavity frame is coupled to the first electrode and to the substrate. The cavity frame forms a perimeter around a cavity.

In some embodiments, a bulk acoustic resonator is prepared by a process that includes forming, on a substrate, a layer of sacrificial material. The process also includes forming, in a perimeter around the sacrificial material, a cavity frame. The process also includes forming, over the sacrificial material and the cavity frame, planarizing material. The planarizing material forms a perimeter around the cavity frame. The process also includes removing a portion of the planarizing material to form a planarized layer that includes the sacrificial material, the cavity frame, and the planarizing material. For an upper surface of the planarized layer that is opposite a lower surface of the planarized layer that is coupled to the substrate, a sacrificial material upper surface of the sacrificial material is substantially level with a cavity frame upper surface of the cavity frame and a planarization material upper surface of the planarization material. The process also includes forming, over the planarized layer, a first electrode (bottom electrode). The process also includes forming, over the first electrode, a piezoelectric film element. The process also includes forming, over the piezoelectric film element, a second electrode (top electrode). The process also includes removing at least a portion of the sacrificial material to form a cavity.

In some embodiments, a cavity includes one or more posts that support the stack and/or one or more elements of the stack is perforated by a plurality of perforations that reduce resonance of spurious waves (e.g., as described with regard to U.S. application Ser. No. 15/789,109, filed Oct. 20, 2017, entitled, "Firm Bulk Acoustic Resonator with Spurious Resonance Suppression," which is hereby incorporated by reference in its entirety).

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 1 is a cross-sectional diagram of a bulk acoustic resonator, in accordance with some embodiments.

FIGS. 6A-6I illustrate an approach for formation of a bulk acoustic resonator that involves etching sacrificial layer material to form a cavity, in accordance with some embodiments.

Figure 1:
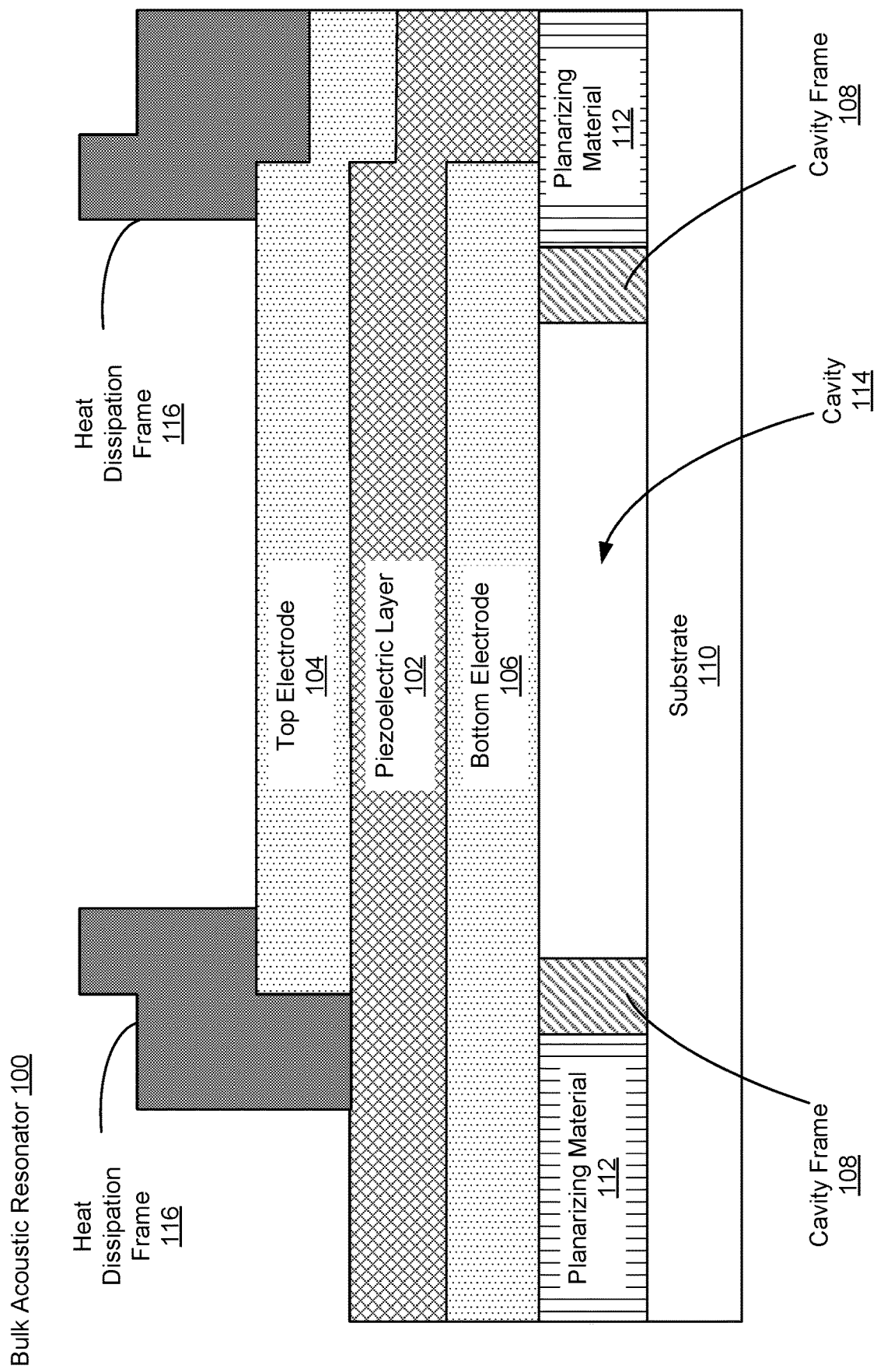

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to improve the structural integrity and thermal stability of the BAW resonator.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross-sectional diagram of a BAW resonator 100, in accordance with some embodiments. BAW resonator 100 includes a stack of a top electrode 104 coupled to a first side of a piezoelectric layer 102 and a bottom electrode 106 coupled to a second side of piezoelectric layer 102. The stack resonates in response to an electrical signal applied between the top electrode 104 and the bottom electrode 106.

Figure 3:
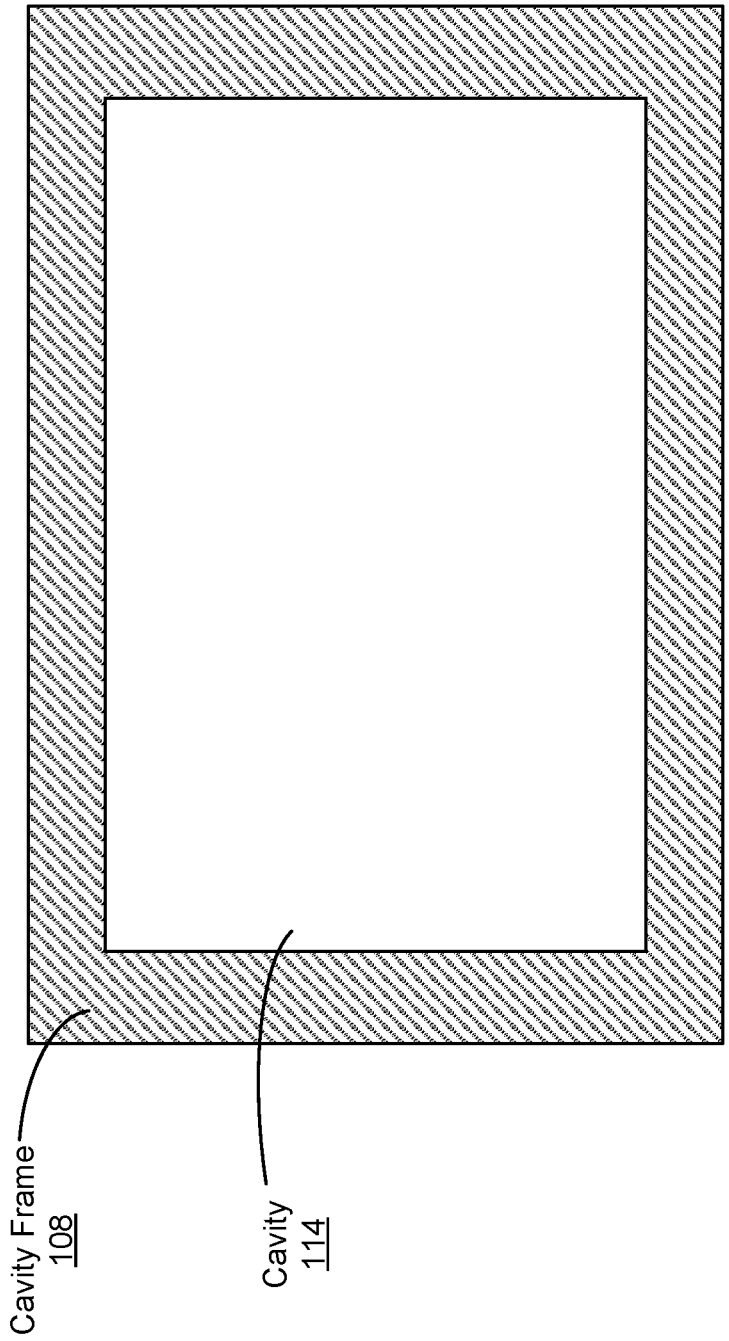
FIG. 3 is a top-down view of a cavity frame of a bulk acoustic resonator, in accordance with some embodiments.

In some embodiments, the stack of piezoelectric layer 102, top electrode 104, and bottom electrode 106 is supported with respect to a substrate 110 by cavity frame 108. Cavity frame 108 is formed with an opening (e.g., a rectangular opening) that passes through cavity frame 108, such that cavity frame 108 forms a perimeter that surrounds cavity 114 (e.g., as illustrated by FIG. 3). In some embodiments, the stack is supported with respect to a substrate 110 by planarizing material 112. A top down view of planarizing material 112 in BAW resonator 100 is provided in FIG. 4. In some embodiments, the stack is supported by cavity frame 108 and planarizing material 112.

Figure 2:
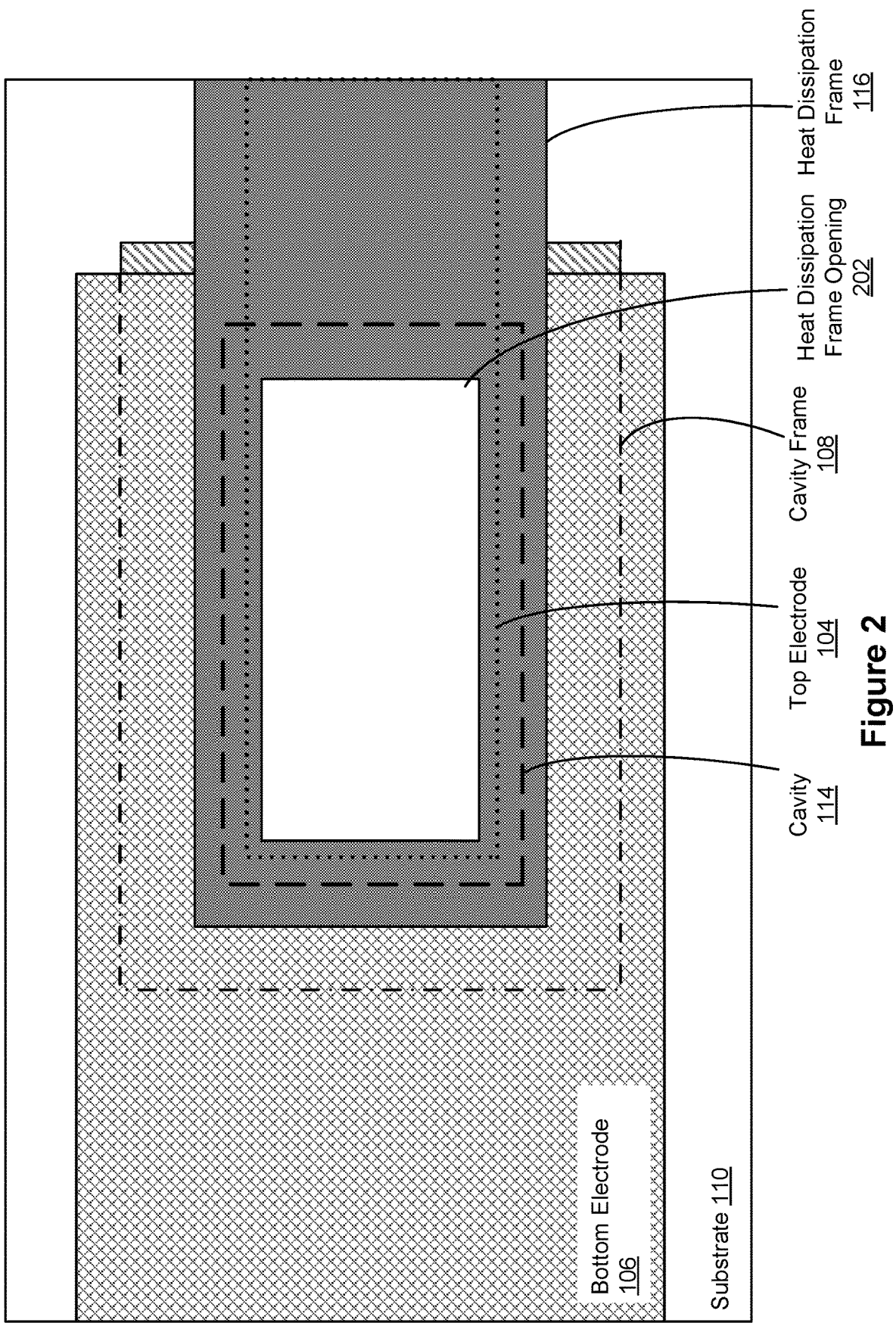
FIG. 2 is a layout view that illustrates a bulk acoustic resonator, in accordance with some embodiments.

Cavity 114 provides a space between the substrate 110 and the stack. The open space below the stack, formed by cavity 114, and the open space above the stack (including an opening 202 in heat dissipation frame 116 as illustrated in FIG. 2), allows the stack to resonate freely in response to the electrical signal. Including cavity frame 108 and/or planarizing material 112 in a support structure provides a high degree of structural integrity in the portion of the structure of BAW resonator 100 that supports the stack suspended over cavity 114.

Figure 5:
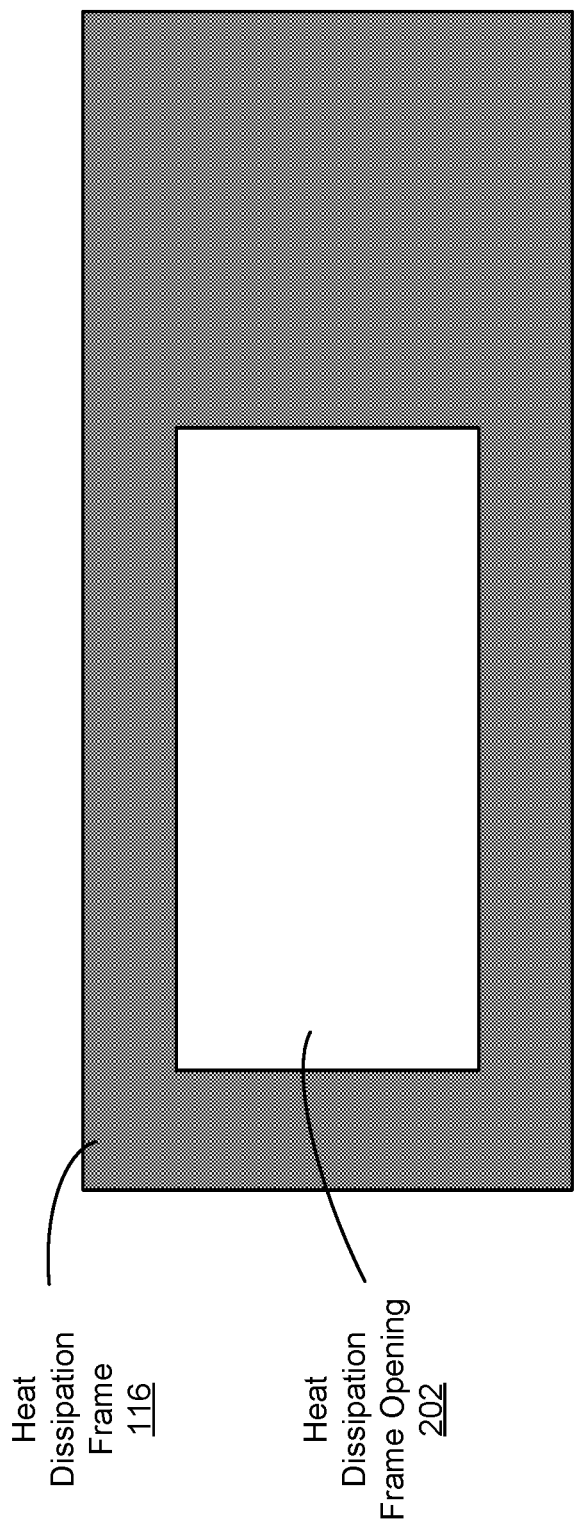
FIG. 5 is a top-down view of a heat dissipation frame of a bulk acoustic resonator, in accordance with some embodiments.

In some embodiments, BAW resonator includes a heat dissipation frame 116 that is coupled to top electrode 104. A top-down view of heat dissipation frame 116 is illustrated by FIG. 5.

In some embodiments, cavity frame 108 and/or heat dissipation frame 116 are formed from or include a material with high thermal conductivity (e.g., aluminum, gold, copper, silver, or diamond) and/or high electrical conductivity (e.g., aluminum, gold, copper, or silver). A cavity frame 108 and/or heat dissipation frame 116 that includes a high thermal conductivity material dissipates heat (e.g., "self-heat" that is generated by the device as the BAW resonator resonates). In this way, temperature-induced frequency shift behavior of the BAW resonator 100 is reduced and/or avoided. For example, a device that includes a heat dissipation frame 116 that is thicker than top electrode 106 and formed from a higher conductivity material than top electrode 106 will provide improved heat dissipation over a device that relies on top electrode 106 for heat dissipation. A cavity frame 108 and/or heat dissipation frame 116 that includes a high electrical conductivity material reduces electrical resistance of the device, improving quality factors (Qs) of the device (e.g., improving the performance of the BAW resonator 100 as a filter).

In some embodiments, cavity frame 108 is formed from a material that results in an acoustic impedance of the cavity frame 108 that varies to a high degree from the acoustic impedance of the BAW stack (e.g., including top electrode 104, piezoelectric layer 102 and bottom electrode 106). The resulting acoustic impedance mismatch between the cavity frame 108 and the BAW stack reduces acoustic energy leakage from the edges of the device. In some embodiments, heat spreader ring 116 is formed from a material that results in an acoustic impedance of the heat spreader ring 116 that varies to a high degree from the acoustic impedance of the BAW stack. The resulting acoustic impedance mismatch between the heat spreader ring 116 and the BAW stack reduces acoustic energy leak from the edges of the device.

FIG. 2 is a layout view of a BAW resonator 100. For clarity, planarizing material 112 and piezoelectric layer 102 are omitted from FIG. 2. A top down view of planarizing material 112 is shown in FIG. 4.

FIG. 3 is a top-down view of a cavity frame 108 of a bulk acoustic resonator, in accordance with some embodiments. In some embodiments, cavity frame 108 has a medial opening (e.g., a rectangular opening in cavity frame 108) that extends through the cavity frame layer (e.g., from the upper surface to the lower surface of the cavity frame layer). Sacrificial material deposited on substrate 110 is removed to form cavity 114 at a location that corresponds to the opening of the cavity frame. In some embodiments, the medial opening in cavity frame 108 is substantially centered along one or more axes of the cavity frame 108.

Figure 4:
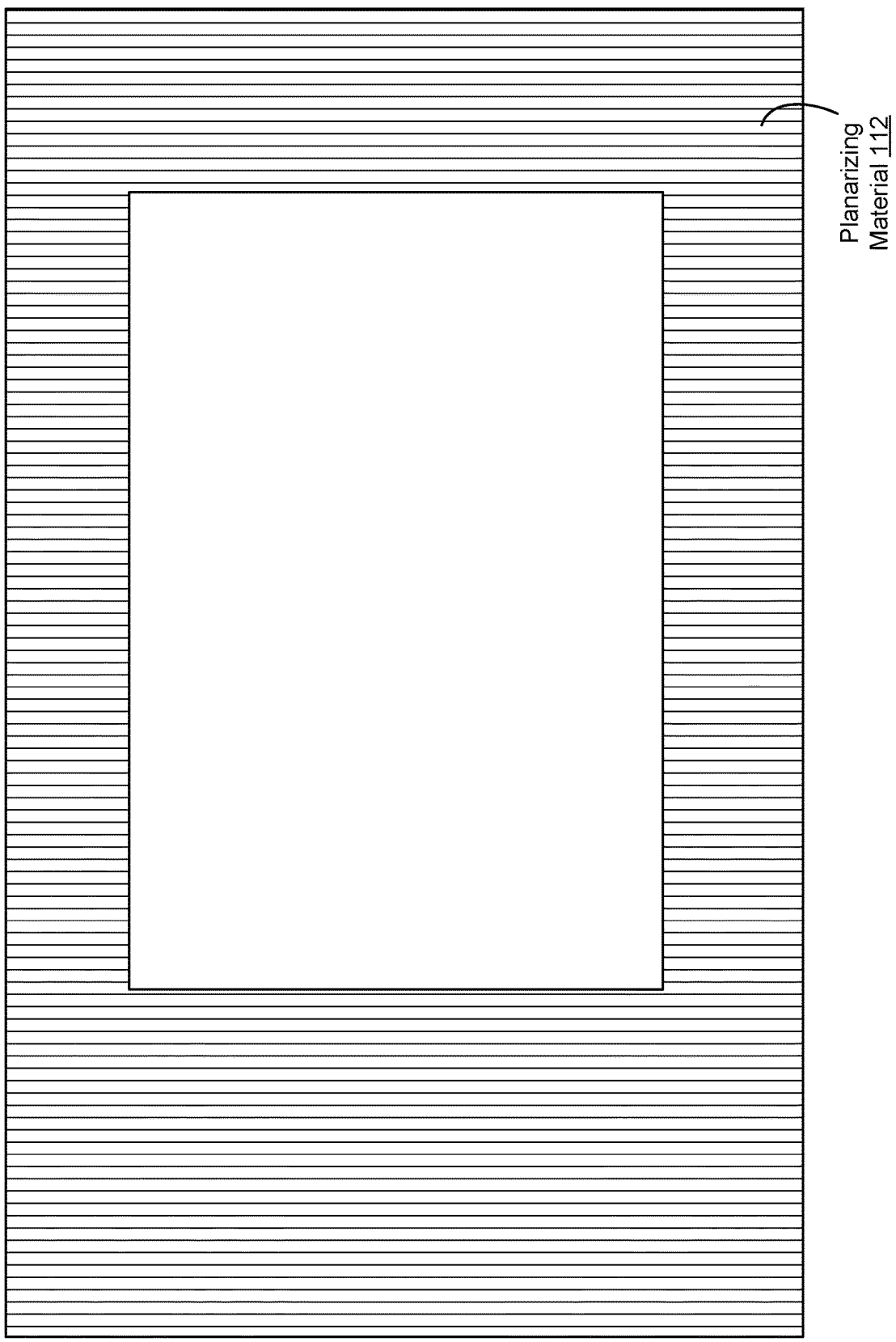
FIG. 4 is a top-down view of planarizing material of a bulk acoustic resonator, in accordance with some embodiments.

FIG. 4 is a top-down view of planarizing material 112 of a bulk acoustic resonator, in accordance with some embodiments. In some embodiments, planarizing material 112 forms a perimeter around cavity frame 108 in planarized layer 604 (see FIG. 6D).

FIG. 5 is a top-down view of a heat dissipation frame 116 of a bulk acoustic resonator, in accordance with some embodiments. In some embodiments, heat dissipation frame 116 has a medial opening 202 (e.g., a rectangular opening in the heat dissipation frame 116) that extends through the heat dissipation frame 116 (e.g., from the upper surface to the lower surface of the heat dissipation frame layer). In some embodiments, medial opening 202 is substantially centered along one or more axes of the heat dissipation frame 116.

FIGS. 6A-6I illustrate cross-sectional views of a bulk acoustic resonator during formation of the bulk acoustic resonator 100, where formation of the bulk acoustic resonator 100 involves etching sacrificial layer material to form a cavity 114, in accordance with some embodiments.

Figure 6A:
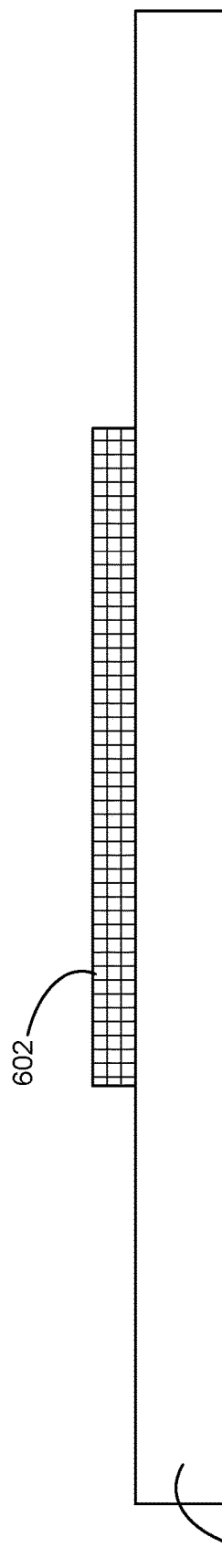

In FIG. 6A, a layer of sacrificial material 602 (e.g., silicon dioxide), is formed (e.g., by chemical vapor deposition) on a substrate 110 (e.g., a single material substrate such as silicon, glass, ceramic, gallium arsenide or silicon carbide). The sacrificial material is patterned (e.g., using a mask and chemical etching) such that sacrificial material 602 occupies an area on substrate 110 that corresponds to the ultimate location of cavity 114.

Figure 6B:
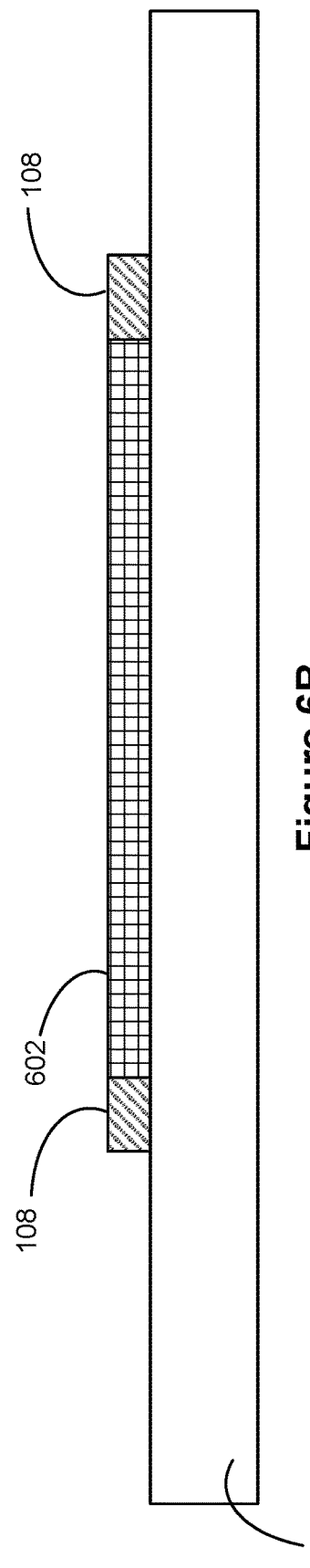

In FIG. 6B, cavity frame 108 is formed (e.g., by e-beam evaporation) around sacrificial material 602. The cavity frame is patterned (e.g., using a mask during the e-beam evaporation) such that cavity frame 108 forms a perimeter around sacrificial material 602 (see FIGS. 1-3).

Figure 6C:
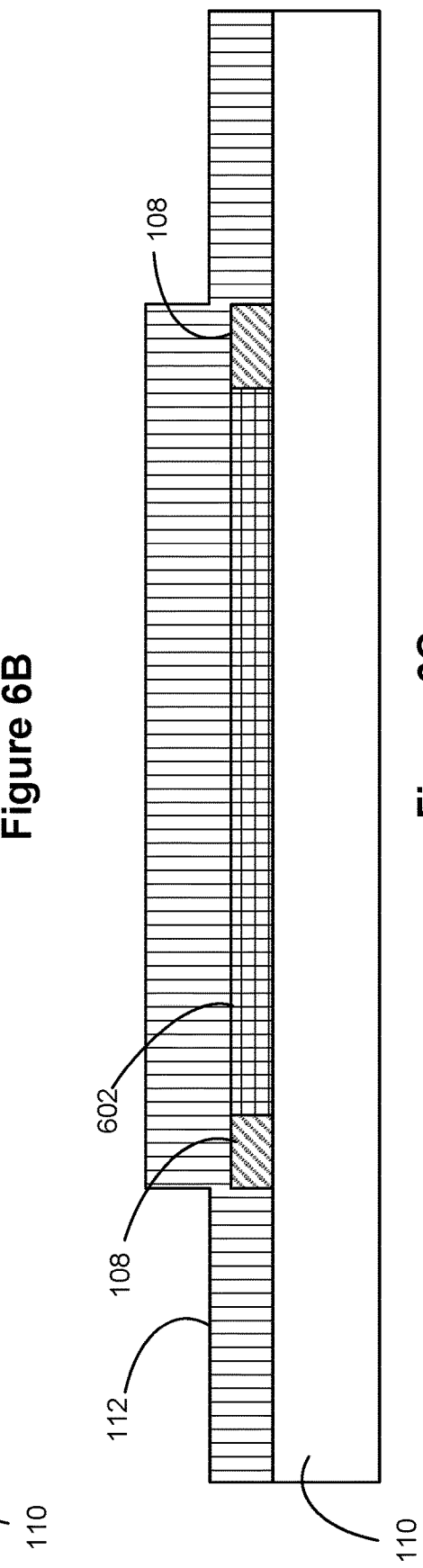

In FIG. 6C, a planarizing material 112 (e.g. polysilicon) is formed (e.g., by chemical vapor deposition) on the substrate 110, cavity frame 108, and sacrificial material 108.

Figure 6D:
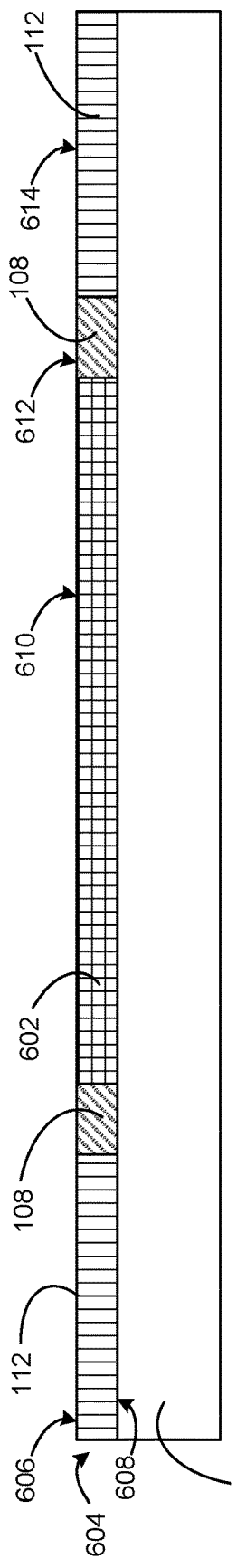

In FIG. 6D, planarizing material 112 is planarized (e.g., by chemical mechanical polishing) to form a level upper surface 606 of a planarized layer 604 that includes planarizing material 112, cavity frame 108, and sacrificial material 602. Planarized layer 604 is formed on, and thus positioned on top of, substrate 110.

Figure 6E:
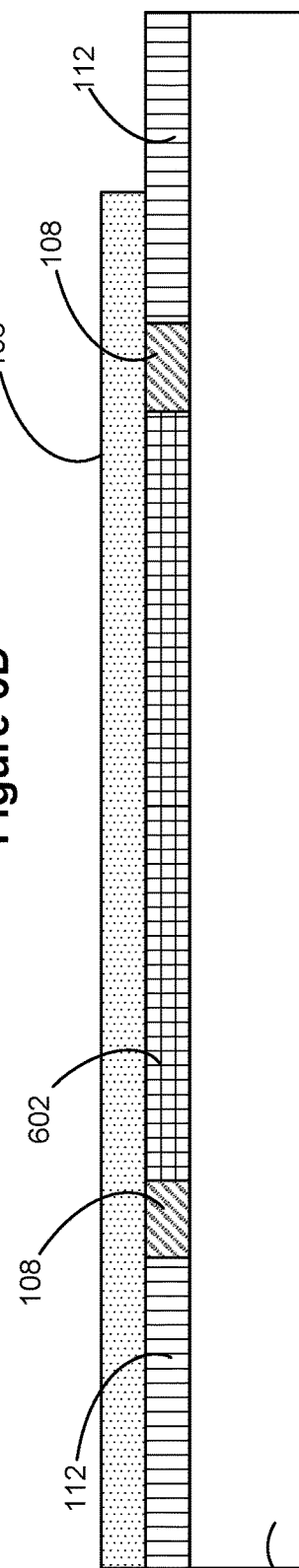

In FIG. 6E, a bottom electrode layer 106 (e.g., molybdenum, aluminum, and/or tungsten) is formed (e.g., by physical vapor deposition) over the planarized layer that includes planarizing material 112, cavity frame 108, and sacrificial material 602. In some embodiments, bottom electrode layer 106 is patterned (e.g., using a mask during the physical vapor deposition) such that bottom electrode layer 106 occupies a region indicated by bottom electrode layer 106 in FIG. 2.

Figure 6F:
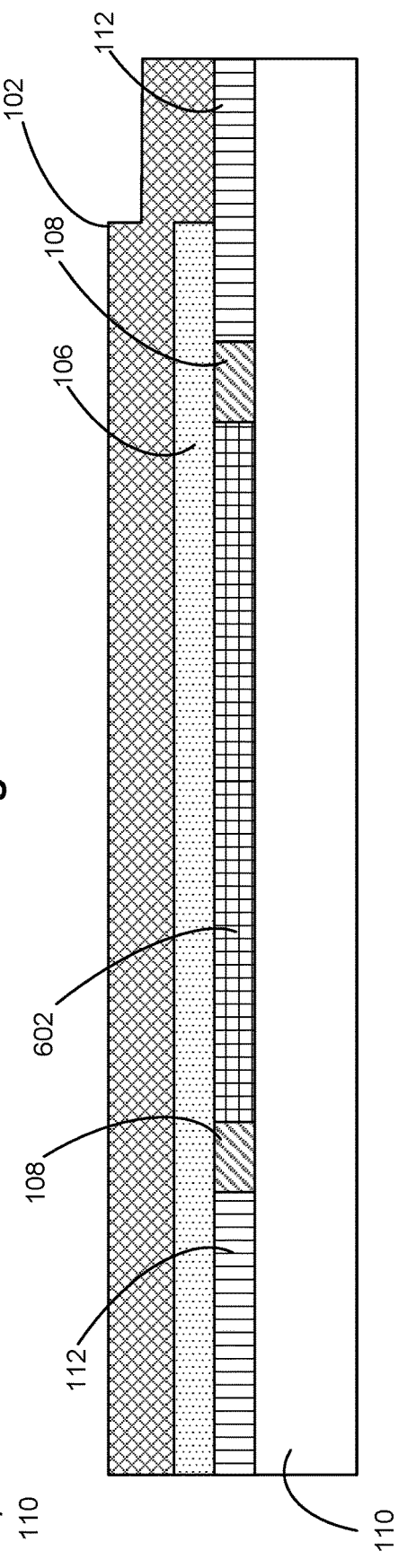

In FIG. 6F, a piezoelectric film layer 102 (e.g., aluminum nitride and/or zinc oxide) is formed (e.g., by physical vapor deposition) over bottom electrode layer 106.

Figure 6G:
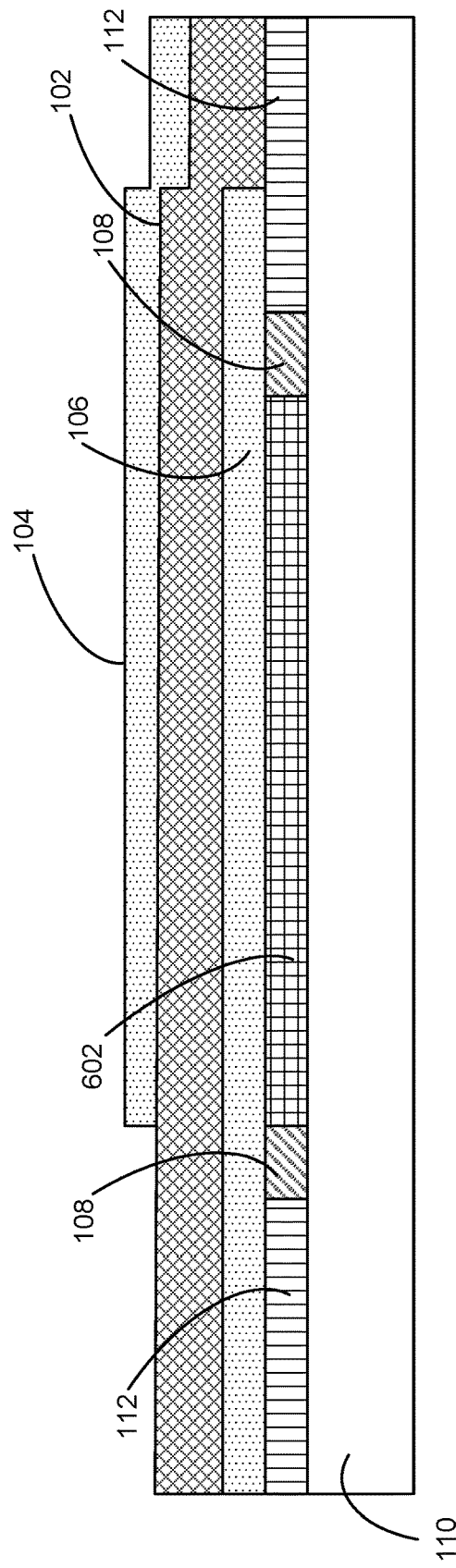

In FIG. 6G, a top electrode layer 104 (e.g., molybdenum, aluminum, and/or tungsten) is formed over the piezoelectric film layer 102. In some embodiments, top electrode layer 104 is patterned (e.g., using a mask during the physical vapor deposition) such that top electrode layer 104 occupies the region indicated by top electrode layer 104 in FIG. 2.

Figure 6H:
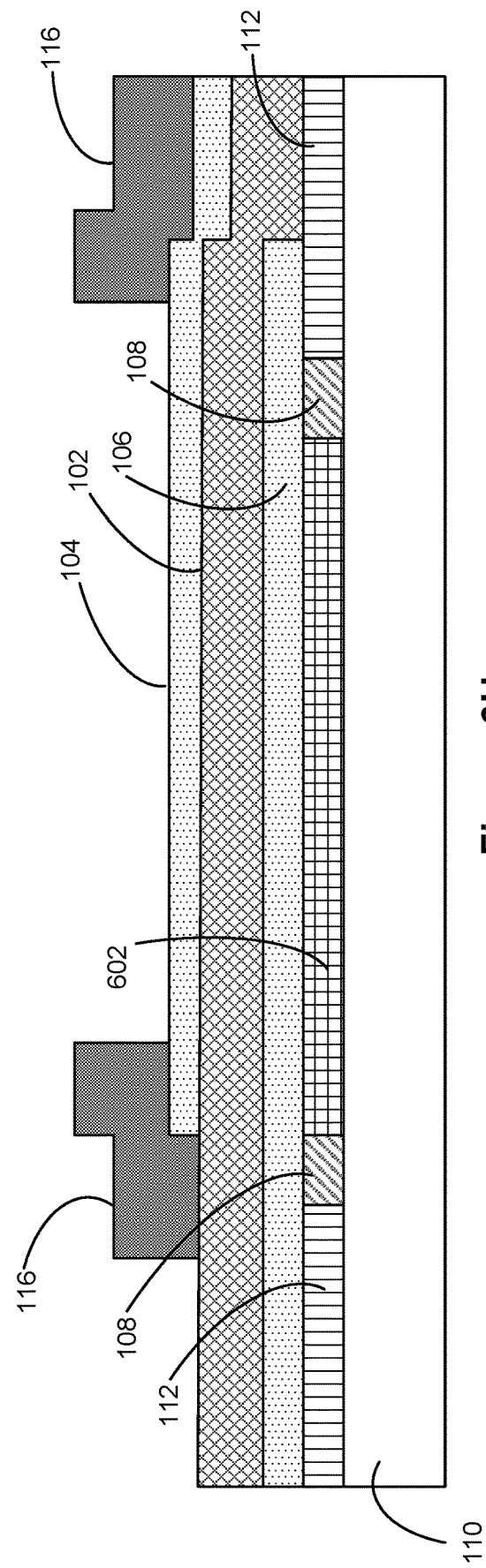

In FIG. 6H, heat dissipation frame 116 is formed (e.g., by e-beam evaporation) over top electrode layer 104. In some embodiments, heat dissipation frame 116 is patterned (e.g., using a mask during the e-beam evaporation) such that it occupies a region as indicated in FIG. 2.

In FIG. 6I, cavity 114 is formed by removing sacrificial material 602 (e.g., by vapor HF etching) from beneath bottom electrode 106. Vapor HF etching advantageously reduces the etch time (e.g., compared with liquid HF) and provides a clean surface of the bottom electrode. In some embodiments, the cavity 114 has a depth and shape that corresponds to the opening of cavity frame 108. In this way, the formation of cavity frame 108 allows formation of a cavity with a predetermined depth and shape.

Process 700 for forming a bulk acoustic resonator 100 (as described below with regard to FIGS. 7A-7B) involves, e.g., deposition, oxidation, lithography patterning, etch, liftoff, and/or chemical mechanical planarization processes, in appropriate sequences, as described below. While these sequences of operations, and the resulting bulk acoustic resonators, are new, the techniques needed to perform each of the individual steps or operations of these processes are well understood in the art, and therefore the individual processing steps or operations are not described in detail. The dotted lines in process 700 illustrate optional operations.

Figure 7A:
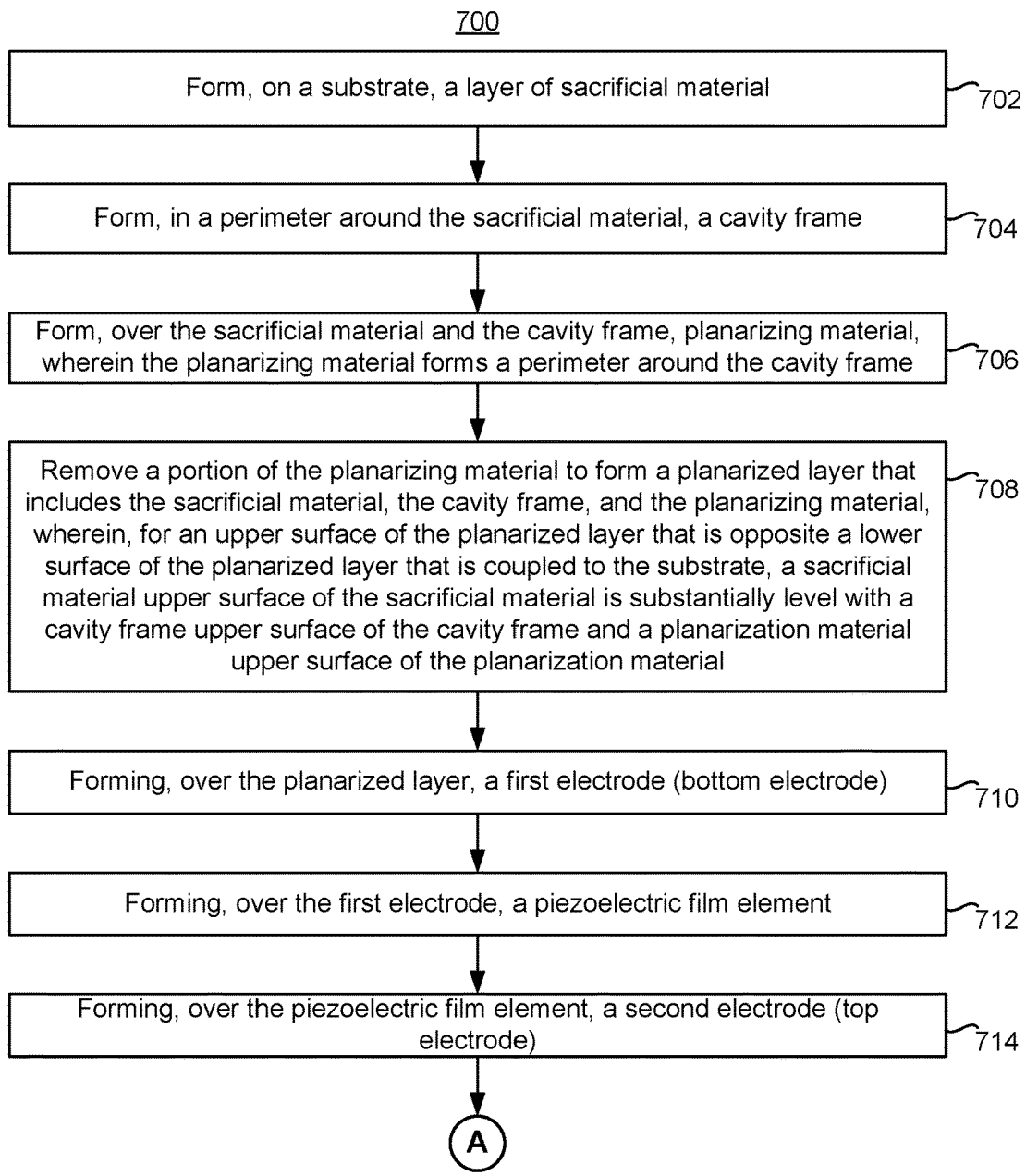
FIGS. 7A-7B illustrate a flowchart representation of a process for forming a bulk acoustic resonator, in accordance with some embodiments.
Figure 7B:
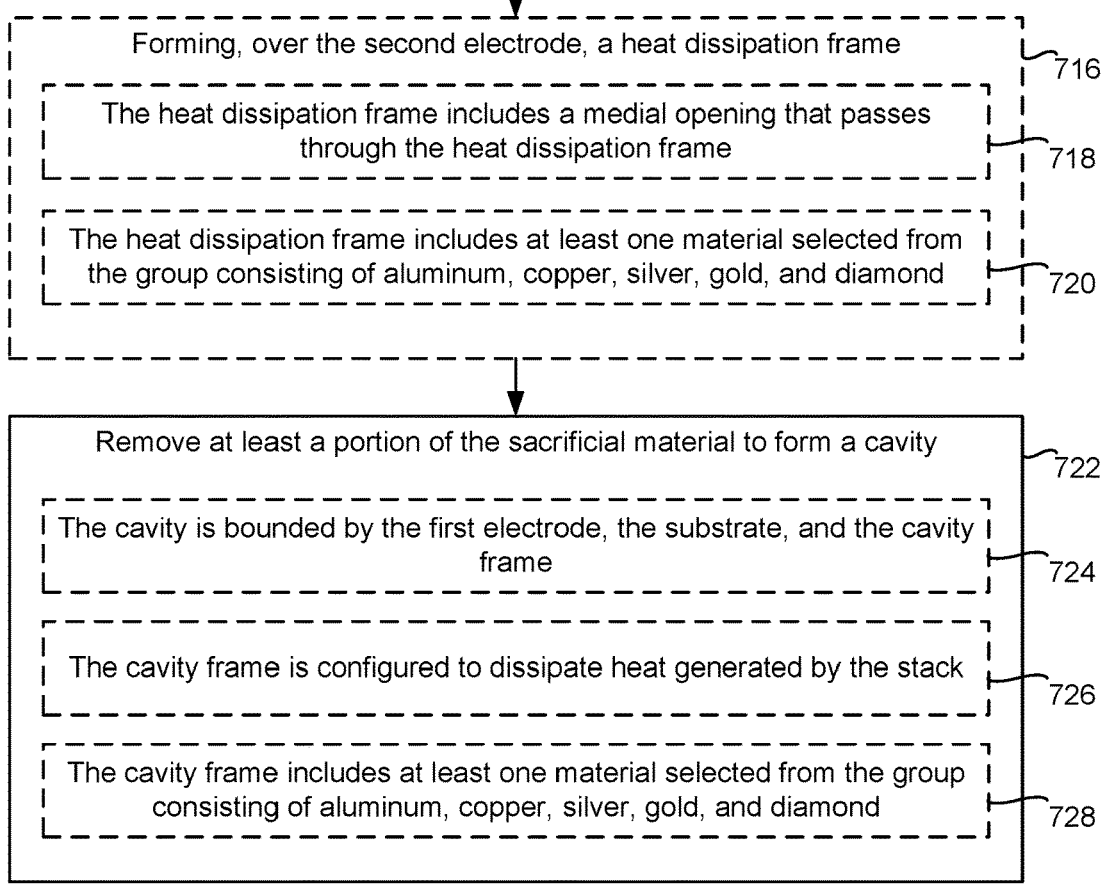

FIGS. 7A-7B illustrates a flowchart representation of a process 700 for forming a bulk acoustic resonator 100 in accordance with some embodiments.

A layer of sacrificial material 602 is formed (702) on a substrate 110 (e.g., as described with regard to FIG. 6A).

A cavity frame 108 is formed (704) in a perimeter around the sacrificial material 602 (e.g., as described with regard to FIG. 6B)

Planarizing material 112 is formed (706) over the sacrificial material 602 and the cavity frame 108 (e.g., as described with regard to FIG. 6C). The planarizing material 112 forms a perimeter around the cavity frame 108.

A portion of the planarizing material 112 is removed (708) to form a planarized layer 604 that includes the sacrificial material 602, the cavity frame 108, and the planarizing material 112 (e.g., as described with regard to FIG. 6D). For an upper surface 606 of the planarized layer 604 that is opposite a lower surface 608 of the planarized layer that is coupled to the substrate 110, a sacrificial material upper surface 610 of the sacrificial material 602 is substantially level with a cavity frame upper surface 612 of the cavity frame 108 and a planarization material upper surface 614 of the planarization material 112 (e.g., as described with regard to FIG. 6D).

A first electrode (bottom electrode 106) is formed (710) over the planarized layer (e.g., as described with regard to FIG. 6E).

A piezoelectric film element 102 is formed (712) over the first electrode (e.g., as described with regard to FIG. 6F).

A second electrode (top electrode 104) is formed (714) over the piezoelectric film element 102 (e.g., as described with regard to FIG. 6G).

In some embodiments, a heat dissipation frame 116 is formed (716) over the second electrode 104 (e.g., as described with regard to FIG. 6H).

In some embodiments, the heat dissipation frame 116 includes (718) a medial opening 202 that passes through the heat dissipation frame 116 (e.g., as illustrated in FIGS. 1-2).

In some embodiments, the heat dissipation frame 116 includes (720) at least one material selected from the group consisting of aluminum, copper, silver, gold, and diamond. In some embodiments, the heat dissipation frame 116 is formed from one or more materials that have a thermal conductivity at 20° C. of at least 200 W/(m·K).

At least a portion of the sacrificial material 602 is removed (722) to form a cavity 114 (e.g., as described with regard to FIG. 6I).

In some embodiments, the cavity 114 is bounded (724) by the first electrode 106, the substrate 110, and the cavity frame 108 (e.g., as illustrated by FIGS. 2-3 and FIG. 6I).

In some embodiments, the cavity frame 108 is configured to dissipate (726) heat generated by the stack. In some embodiments, the cavity frame 108 is formed from one or more materials that have a thermal conductivity at 20° C. of at least 200 W/(m·K).

In some embodiments, the cavity frame 108 includes (728) at least one material selected from the group consisting of aluminum, copper, silver, gold, and diamond.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A bulk acoustic resonator, comprising:
a stack that includes:
a first electrode (bottom electrode) coupled to a first side of a piezoelectric layer; and
a second electrode (top electrode) coupled to a second side of the piezoelectric layer;
wherein the stack is configured to resonate in response to an electrical signal applied between the first electrode and the second electrode;
a cavity frame coupled to the first electrode and to a substrate, wherein the cavity frame forms a perimeter around a cavity and wherein the substrate is a single material substrate; and
a planarizing material in direct contact with the substrate and coupled to the first electrode, wherein:
the cavity frame forms a boundary between the planarizing material and the cavity,
the planarizing material comprises a material distinct from the substrate, and
an upper surface of the planarizing material is substantially level with an upper surface of the cavity frame.

2. The bulk acoustic resonator of claim 1, wherein the cavity is formed by removing sacrificial material from a region below the stack and above the substrate.

3. The bulk acoustic resonator of claim 1, wherein the cavity is bounded by the first electrode, the substrate, and the cavity frame.

4. The bulk acoustic resonator of claim 1, wherein the cavity frame is configured to dissipate heat generated by the stack.

5. The bulk acoustic resonator of claim 1, wherein the cavity frame is distinct from the first electrode and includes at least one material selected from the group consisting of aluminum, copper, silver, and diamond.

6. The bulk acoustic resonator of claim 1, including a heat dissipation frame coupled to the second electrode, wherein the heat dissipation frame is configured to dissipate heat generated by the stack.

7. The bulk acoustic resonator of claim 6, wherein the heat dissipation frame includes a medial opening that passes through the heat dissipation frame.

8. The bulk acoustic resonator of claim 6, wherein the heat dissipation frame includes at least one material selected from the group consisting of aluminum, copper, silver, gold, and diamond.

9. A bulk acoustic resonator prepared by a process comprising the steps of:
forming, on a substrate, a layer of sacrificial material, wherein the substrate is a single material substrate;
forming, in a perimeter around the sacrificial material, a cavity frame;
forming, over the sacrificial material and the cavity frame, a planarizing material, wherein the planarizing material forms a perimeter around the cavity frame;
removing a portion of the planarizing material to form a planarized layer that includes the sacrificial material, the cavity frame, and the planarizing material, wherein, for an upper surface of the planarized layer that is opposite a lower surface of the planarized layer that is in direct contact with the substrate, a sacrificial material upper surface of the sacrificial material is substantially level with a cavity frame upper surface of the cavity frame and a planarizing material upper surface of the planarizing material;
forming, over the planarized layer, a first electrode (bottom electrode);
forming, over the first electrode, a piezoelectric film element;
forming, over the piezoelectric film element, a second electrode (top electrode); and
removing at least a portion of the sacrificial material to form a cavity,
wherein the first electrode, the piezoelectric film element, and the second electrode comprise a stack.

10. The bulk acoustic resonator of claim 9, wherein the cavity is bounded by the first electrode, the substrate, and the cavity frame.

11. The bulk acoustic resonator of claim 9, wherein the cavity frame is configured to dissipate heat generated by the stack.

12. The bulk acoustic resonator of claim 9, wherein the cavity frame includes at least one material selected from the group consisting of aluminum, copper, silver, gold, and diamond.

13. The bulk acoustic resonator of claim 9, wherein the process includes forming, over the second electrode, a heat dissipation frame.

14. The bulk acoustic resonator of claim 13, wherein the heat dissipation frame includes a medial opening that passes through the heat dissipation frame.

15. The bulk acoustic resonator of claim 13, wherein the heat dissipation frame includes at least one material selected from the group consisting of aluminum, copper, silver, gold, and diamond.

* * * * *